United States Patent
Godshalk et al.

(10) Patent No.: US 8,512,800 B2
(45) Date of Patent: Aug. 20, 2013

(54) OPTIMAL ACOUSTIC IMPEDANCE MATERIALS FOR POLISHED SUBSTRATE COATING TO SUPPRESS PASSBAND RIPPLE IN BAW RESONATORS AND FILTERS

(75) Inventors: Edward Martin Godshalk, Newberg, OR (US); Rick D. Lutz, Portland, OR (US); Masud Hannan, Portland, OR (US); Ralph N. Wall, Beaverton, OR (US); Uppili Sridhar, Plano, TX (US)

(73) Assignee: Triquint Semiconductor, Inc., Hillsboro, OR (US)

(*) Notice: Subject to any disclaimer, the term of this patent is extended or adjusted under 35 U.S.C. 154(b) by 1130 days.

(21) Appl. No.: 11/950,149

(22) Filed: Dec. 4, 2007

(65) Prior Publication Data
US 2009/0142480 A1    Jun. 4, 2009

(51) Int. Cl.
*B05D 1/12*    (2006.01)
*H03H 9/00*    (2006.01)

(52) U.S. Cl.
USPC ............................. 427/100; 333/189; 333/191

(58) Field of Classification Search
USPC ........................................................ 427/100
See application file for complete search history.

(56) References Cited

U.S. PATENT DOCUMENTS

| | | | |
|---|---|---|---|
| 5,325,012 A | 6/1994 | Sato et al. | |
| 5,373,268 A | 12/1994 | Dworsky et al. | |
| 6,060,818 A | 5/2000 | Ruby et al. | |
| 6,239,536 B1 | 5/2001 | Lakin | |
| 6,291,931 B1 | 9/2001 | Lakin | |
| 6,480,074 B1 | 11/2002 | Kaitila et al. | |
| 6,577,043 B2 | 6/2003 | Tsukai et al. | |
| 6,878,604 B2 | 4/2005 | Aigner et al. | |
| 6,943,647 B2 | 9/2005 | Aigner et al. | |
| 7,002,437 B2 | 2/2006 | Takeuchi et al. | |
| 7,221,242 B2 | 5/2007 | Asai et al. | |
| 7,463,117 B2 | 12/2008 | Ohara et al. | |
| 7,466,213 B2 * | 12/2008 | Lobl et al. | 333/187 |
| 7,554,426 B2 | 6/2009 | Lee et al. | |
| 7,612,488 B1 | 11/2009 | Bouche et al. | |
| 2001/0008205 A1 | 7/2001 | Wilke et al. | |

(Continued)

FOREIGN PATENT DOCUMENTS

| | | |
|---|---|---|
| EP | 0 609 555 | 8/1994 |
| EP | 0 771 070 | 5/1997 |

(Continued)

OTHER PUBLICATIONS

Loebl et al. "low-level effects in sbars and their applicatin to device optimisation" IEEE Ultrasonics Symposium 2003.*

(Continued)

*Primary Examiner* — Michael Cleveland
*Assistant Examiner* — Austin Murata
(74) *Attorney, Agent, or Firm* — Blakely Sokoloff Taylor & Zafman LLP (57) ABSTRACT

Methods of reducing phase and amplitude ripples in a BAW resonator frequency response by providing a substrate, fabricating a Bragg mirror having alternate layers of a high acoustic material and a low acoustic material on a first surface of the substrate, fabricating a BAW on the Bragg mirror, and coating a second side of the substrate opposite the first side with a lossy material having an acoustic impedance in the range of 0.01× to 1.0× the acoustic impedance of the layers of high impedance material, the second surface of the substrate being a polished surface. Various embodiments are disclosed.

9 Claims, 10 Drawing Sheets

(56) References Cited

U.S. PATENT DOCUMENTS

| | | | |
|---|---|---|---|
| 2002/0030420 | A1 | 3/2002 | Tsukai et al. |
| 2002/0084873 | A1 | 7/2002 | Ella et al. |
| 2003/0087177 | A1* | 5/2003 | Miyamoto et al. ............ 430/157 |
| 2003/0199105 | A1* | 10/2003 | Kub et al. .......................... 438/3 |
| 2004/0140869 | A1* | 7/2004 | Marksteiner et al. ......... 333/189 |
| 2004/0146264 | A1 | 7/2004 | Auner et al. |
| 2004/0212277 | A1 | 10/2004 | Stommer |
| 2004/0227591 | A1* | 11/2004 | Aigner et al. ................. 333/191 |
| 2005/0073027 | A1* | 4/2005 | Irikura et al. ................. 257/615 |
| 2005/0093157 | A1 | 5/2005 | Noguchi et al. |
| 2006/0043507 | A1* | 3/2006 | Lobl et al. ..................... 257/416 |
| 2006/0202779 | A1* | 9/2006 | Fazzio et al. .................. 333/187 |
| 2008/0042780 | A1 | 2/2008 | Lee et al. |
| 2008/0150653 | A1 | 6/2008 | Hara et al. |

FOREIGN PATENT DOCUMENTS

| | | |
|---|---|---|
| EP | 1 418 671 | 5/2004 |
| EP | 1 748 556 | 1/2007 |
| WO | WO-03/006701 | 1/2003 |
| WO | WO-2006/004470 | 1/2006 |
| WO | WO-2006/101450 | 9/2006 |

OTHER PUBLICATIONS

"International Search Report and Written Opinion of the International Searching Authority Dated Nov. 14, 2008", International Application No. PCT/US2008/008527.

"International Search Report and Written Opinion of the International Searching Authority Dated Nov. 7, 2008", International Application No. PCT/US2008/007282.

"International Search Report and Written Opinion of the International Searching Authority Dated Sep. 8, 2008", International Application No. PCT/US2008/005628.

Auner, G. W., et al., "Microstructure of low temperature grown AlN thin films on Si (111)", *Journal of Applied Physics*, vol. 85, No. 11, (Jun. 1, 1999), pp. 7879-7883.

Fattinger, G.G., et al., "Optimization of Acoustic Dispersion for High Performance Thin Film BAW Resonators", *IEEE Ultrasonics Symposium*, (2005), pp. 1175-1178.

Kaitila, J., et al., "Spurious Resonance Free Bulk Acoustic Wave Resonators", *IEEE Ultrasonics Symposium*, (2003), pp. 84-87.

Loebl, H.P., et al., "Low-Level Effects in Sbars and Their Application to Device Optimisation", *IEEE Ultrasonics Symposium*, (2003), pp. 182-186.

Loebl, H.P., et al., "RF Bulk Acoustic Wave Resonators and Filters", *Journal of Electroceramics*, No. 12, (2004), pp. 109-118.

Park, Jae Y., et al., "Micromachined FBAR RF Filters for Advanced Handset Applications", *12th International Conference on Solid State Sensors, Actuators and Microsystems*, (2003), pp. 911-914.

Pensala, Tuomas, et al., "Spurious resonance suppression in ZnO based thin-film BAW resonators: FEM modeling and experiment", *IEEE Ultrasonics Symposium*, (2005), pp. 1844-1847.

Schmidhammer, Edgar, et al., "High Volume Production of a fully matched 5050 PCS-CDMA-BAW Duplexer", *IEEE Ultrasonics Symposium*, (2006), pp. 329-332.

Ueda, Masanori, et al., "High-Q Resonators using FBAR/SAW Technology and their Applications", *IEEE*, (2005), 4 pgs.

W. E. Newell, "Face-Mounted Piezoelectric Resonators", Proceedings of the IEEE, Jun. 1965, pp. 575-581, vol. 53.

K.M. Lakin et al., "Stacked Crystal Filters Implemented with Thin Films", 43rd Annual Symposium on Frequency Control, May 1989, pp. 536-543.

R. Aigner et al., "Advancement of MEMS into RF-Filter Applications", Proceedings of the IEDM, Dec. 2002, pp. 897-900.

Lakin, K.M. and Lakin K. G., Numerical Analysis of Thin Film BAW Resonators, IEEE 2003 Ultrasonics Symposium, Oct. 5-8, Paper 4A-3, TFR Technologies, Inc., Sep. 27, 2003.

* cited by examiner

OPTIMAL ACOUSTIC IMPEDANCE MATERIALS FOR POLISHED SUBSTRATE COATING TO SUPPRESS PASSBAND RIPPLE IN BAW RESONATORS AND FILTERS

BACKGROUND OF THE INVENTION

1. Field of the Invention

The present invention relates to the field of piezoelectric resonators.

2. Prior Art

Piezoelectric resonators are primarily used for signal filtering and reference oscillators. These resonators are commonly referred to as FBAR (film bulk acoustic resonators) or BAW (bulk acoustic wave resonators).

Figure 1:
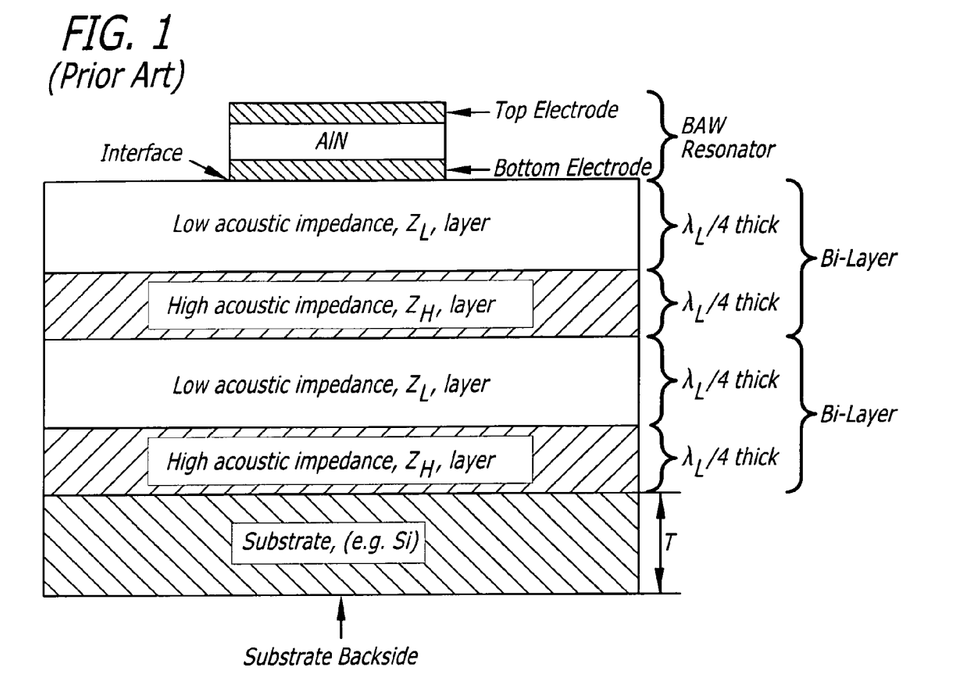
FIG. 1 is a schematic drawing of a solidly mounted resonator on a Bragg mirror stack of two bi-layers.

The resonator consists of piezoelectric material (i.e., aluminum nitride, AlN) sandwiched between two electrodes as shown in FIG. 1. For good performance the resonator must be acoustically isolated from the mechanical substrate (typically a silicon wafer). This is accomplished by an air gap (FBAR) or a Bragg mirror for solidly mounted resonators (SMR) of alternating high and low acoustic impedance materials designed to be one-quarter wavelength thick ($\lambda_L/4$) at the operating frequency. These devices are not new and are well documented in the literature. (See "Face-mounted piezoelectric resonators", W. E. Newell, Proc. IEEE, Vol. 53, June 1965, Pgs. 575-581, U.S. Pat. No. 5,373,268, "Stacked Crystal Filters Implemented with Thin Films", K. M. Lakin et al., 43rd Ann. Freq. Contr. Symp., May 1989, Pgs. 536-543 and "Advancement of MEMS into RF-Filter Applications", R. Aigner et al., Proc. of IEDM 2002, San Francisco, Dec. 8-11, 2002, Pgs. 897-900.) The following is more specific to the SMR class of BAW devices.

Figure 2:
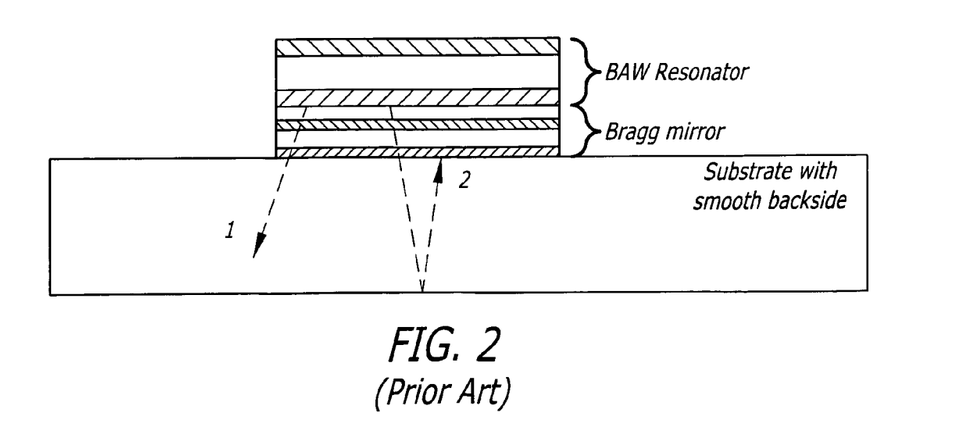
FIG. 2 illustrates the leakage of acoustic energy through the Bragg mirror.

Bragg mirrors have been developed in both microwave and optical applications to create a high reflection coefficient at a specified interface. In the case of the BAW resonator, the interface of interest is between the bottom electrode of the BAW resonator and the top of the Bragg mirror stack. An ideal Bragg mirror stack would create a unity reflection coefficient at this interface and perfectly isolate the BAW resonator from the substrate. In that case the substrate (typically silicon) would have no influence on the performance of the BAW resonator. This is not achievable in practice, since for an acceptable level of isolation (i.e., nominally 99% or better reflection coefficient) at the interface, several layers of high and low impedance materials (also called bi-layers) are required, which is generally not practical from a processing or cost standpoint. Typically only 2 to 3 bi-layers are practical, which allows some leakage of acoustic energy into the substrate that manifests itself as loss in the passband. Of interest to this invention is that when the substrate is an odd multiple of quarter wavelengths thick, it can present a boundary condition at the bottom of the Bragg mirror stack that will cause the required reflection condition to fail, causing ripples in the passband. These ripples are harmonically related to the substrate thickness T. Both of these phenomena are shown in FIG. 2. This condition can be prevented if a lossy material having an optimal acoustic impedance is applied to the substrate backside.

Referring to FIG. 2, the acoustic energy that leaks through the Bragg mirror causes two problems. The first is increased insertion loss due to energy leakage out of the BAW resonator, as illustrated by arrow 1. The second is reflections of acoustic energy off of the substrate backside, causing a boundary condition at the Bragg mirror backside that results in ripples in the BAW resonator passband, at frequencies where the substrate is an odd number of quarter wavelengths thick, as illustrated by arrow 2.

Figure 3:
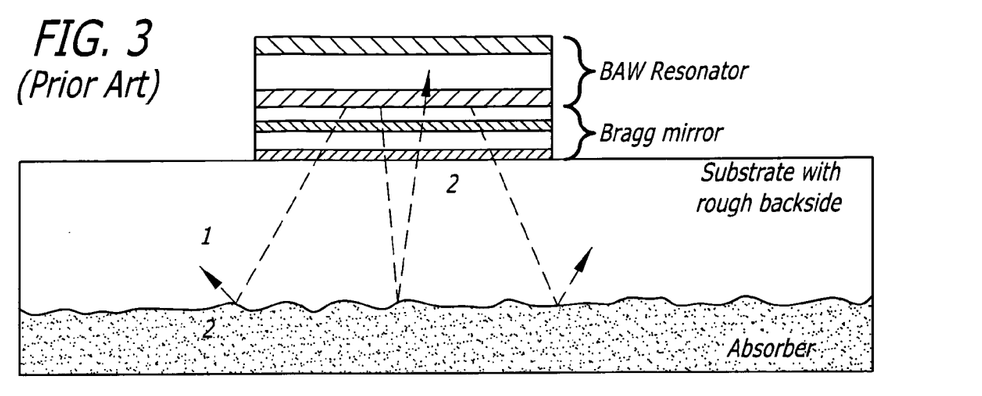
FIG. 3 schematically illustrates a substrate with a rough backside and absorber on the backside.

It has been proposed that BAW resonator performance can be improved by roughening the substrate backside, by either mechanical or chemical means (See "Face-mounted piezoelectric resonators", W. E. Newell, Proc. IEEE, Vol. 53, June 1965, Pgs. 575-581 and U.S. Pat. No. 5,373,268) and/or adding an epoxy (See "Face-mounted piezoelectric resonators", W. E. Newell, Proc. IEEE, Vol. 53, June 1965, Pgs. 575-581) or other material to that rough backside as shown in FIG. 3. The theory is that the acoustic energy that leaks through the Bragg stack will be either "partially scattered" by the rough surface or absorbed by the epoxy (or other absorptive material). This will in turn improve the passband performance by reducing the amplitude of acoustic energy reflected back into the bottom of the Bragg stack and hence reduce passband ripple.

FIG. 3 schematically illustrates a substrate with a rough backside and absorber on the backside. Acoustic energy that leaks through the Bragg mirror stack is scattered by the rough surface and absorbed. The benefit is reduced ripple due to attenuation of reflected acoustic energy into the BAW resonator. The penalty is energy loss in the passband due to scattered and absorbed energy.

DETAILED DESCRIPTION OF THE PREFERRED EMBODIMENTS

Figure 4A:
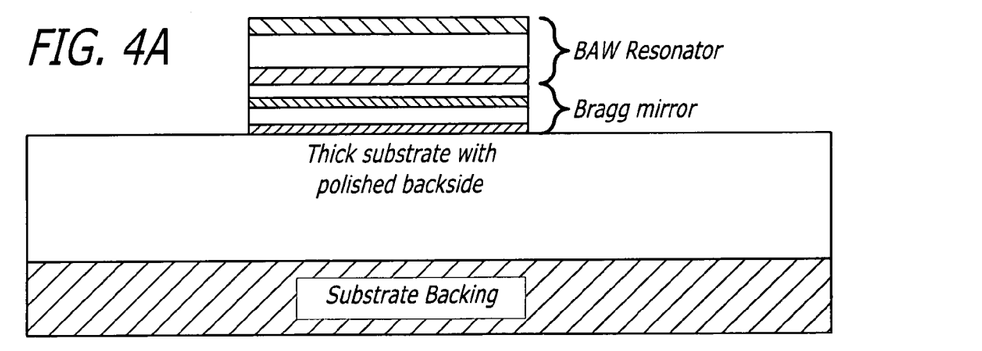
FIGS. 4A and 4B illustrate a typical BAW resonators and Bragg mirrors on a substrate.
Figure 4B:
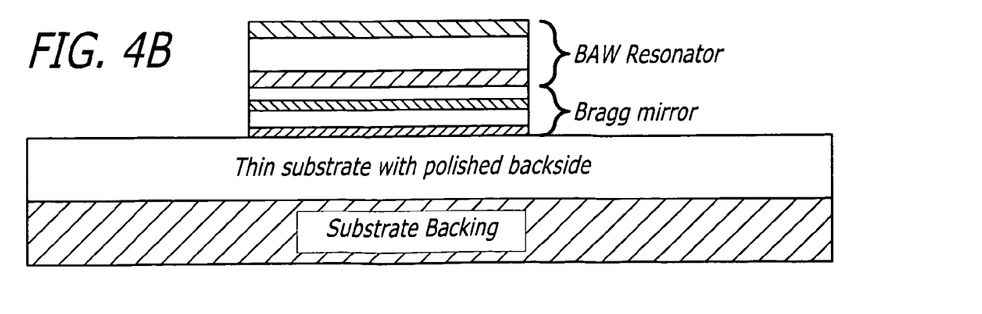

A typical BAW resonator and Bragg mirror on a substrate is shown in FIGS. 4A and 4B, specifically, in FIG. 4A on a nominally 725 μm thick substrate and in FIG. 4B on a nominally 325 μm thick substrate. The scattering parameter transmission coefficient ($S_{21}$) through a filter constructed using thick (FIG. 4A) and thin (FIG. 4B) substrates are shown in FIG. 5.

In FIGS. 4A and 4B, the BAW resonators on a thick (725 μm) and thin (325 μm) substrate have a polished backside. The filter on the 725 μm thick substrate shows in FIG. 5 a passband ripple occurring nominally every 6.1 MHz due to the primary longitudinal mode leaking out of the BAW resonator bottom electrode through the Bragg mirror and then into the substrate. At frequencies where the substrate thickness T is an odd multiple of longitudinal quarter wavelengths, a condition can exist at the bottom of the Bragg mirror causing ripples in the passband if the acoustic impedance of the substrate backing is not in a proper range of values. These ripples are caused by increased transmission of acoustic energy into the Bragg mirror when a high impedance condition exists at the top of the substrate, as subsequently explained in greater detail. It will be shown that for a 725 μm "thick" silicon substrate, the ripples are spaced at 6.1 MHz intervals, and for a 325 μm "thin" substrate they are spaced at 13.5 MHz. The advantage to using a thinned substrate is that there are fewer ripples in the passband.

Figure 5:
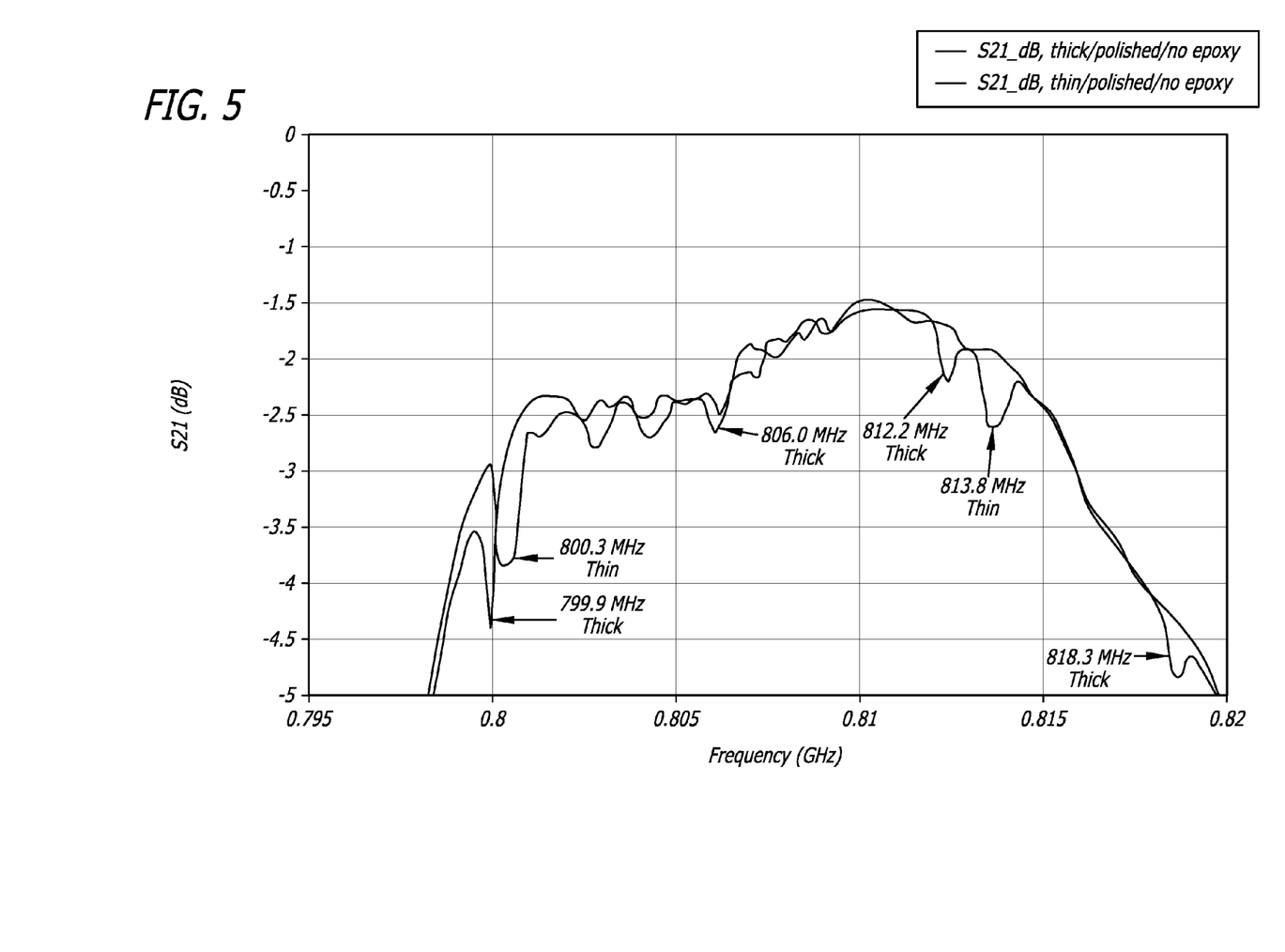
FIG. 5 shows S21 data for a filter using BAW resonators on a 725 µm versus 325 µm thick substrate.

This is shown FIG. 5, wherein the transmission coefficient $S_{21}$ data for a filter using BAW resonators on a 725 μm versus 325 μm thick substrate is presented. On the 725 μm thick substrate, leakage of the longitudinal mode into the substrate causes a passband ripple every 6.1 MHz. By thinning the substrate to 325 μm, the ripple spacing is increased to 13.5 MHz. The other ripples are due to spurious modes that are not strongly influenced by the substrate thickness.

Figure 6:
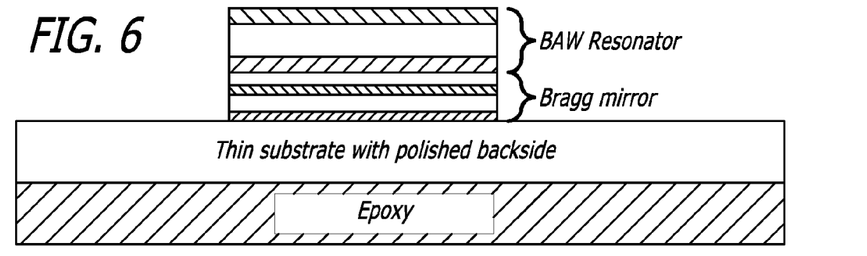
FIG. 6 illustrates a BAW resonator on a 325 µm thick substrate with a polished backside with epoxy.

To reduce passband ripple, the substrate backside can be coated with a lossy material preferably having an acoustic impedance in the range of 0.01× to 1.0× that of the acoustic impedance of the high impedance Bragg mirror layer. This prevents a condition that causes the Bragg mirror to not function correctly, as subsequently described. To accomplish this, the material, such as epoxy, is bonded to a polished substrate backside as shown in FIG. 6. The procedure is to first backgrind the wafer to the desired thickness and then fine polish (peak-to-peak roughness ~1000 Å) the backside surface. By polishing the surface, a more uniform interface is created to provide a well defined boundary condition.

When Tungsten is the Bragg mirror high impedance layer ($101 \times 10^6$ kg/m²s), the material applied to the polished substrate backside preferably should have an acoustic impedance in the range of $1-100 \times 10^6$ kg/m²s. In the following examples, an epoxy is used that has an acoustic impedance of approximately $2.4 \times 10^6$ kg/m²s, which satisfies this condition.

Figure 7:
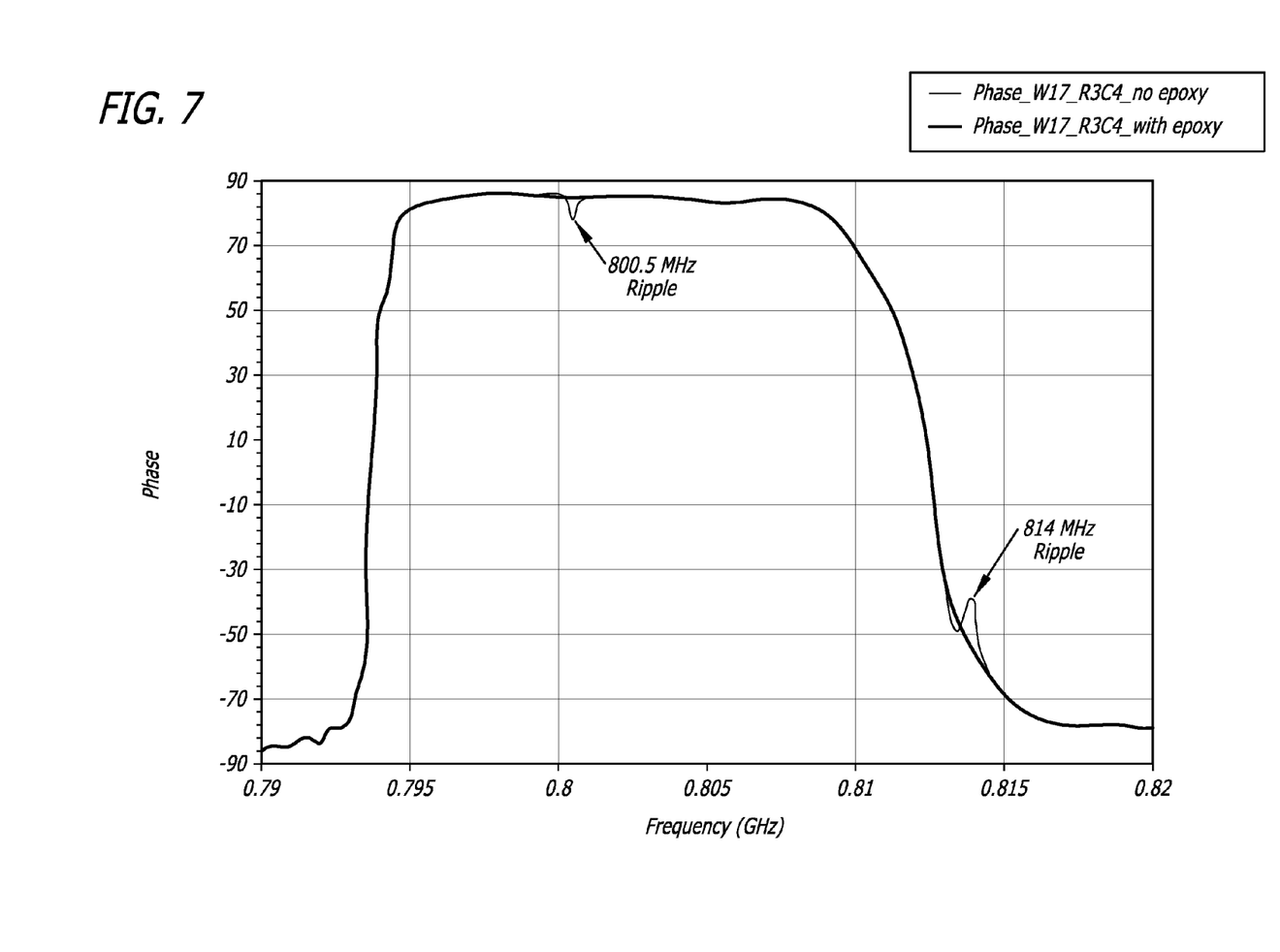
FIG. 7 shows the phase response for a BAW resonator on a 325 µm thick substrate with a polished backside, with and without epoxy.
Figure 8:
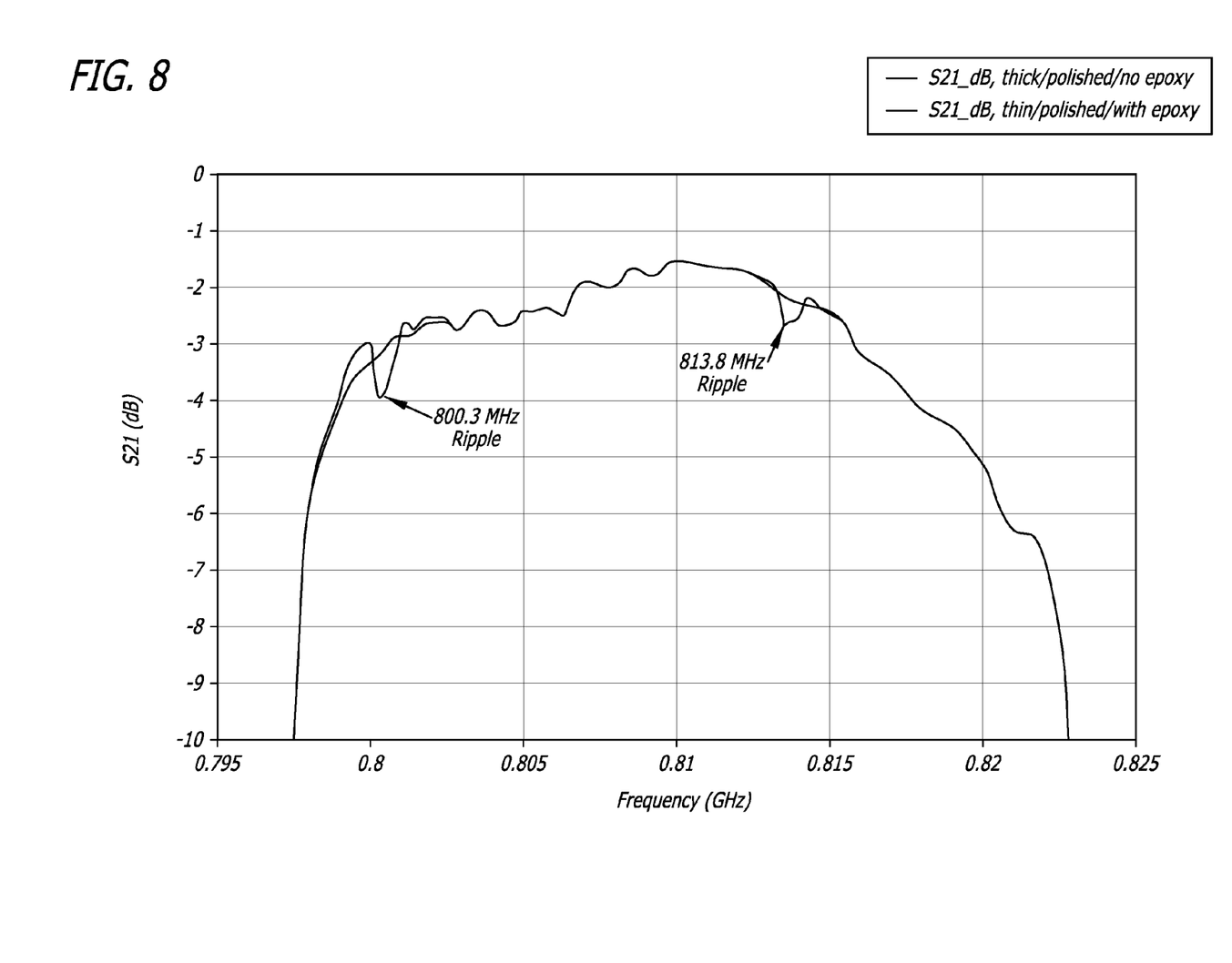
FIG. 8 shows the associated ripple in the transmission coefficient ($S_{21}$) for a filter constructed out of similar BAW resonators on a 325 µm thick substrate with a polished backside, with and without epoxy.

Reduction of passband ripple after epoxy is applied is shown in FIGS. 7 and 8 for a 325 μm thick silicon substrate. In FIG. 7, the phase of the input impedance of a single BAW resonator is shown for a BAW resonator on a 325 μm thick substrate with a polished backside, with and without epoxy. In the case without epoxy, the substrate is placed on a foam layer having an acoustic impedance on the order of that for air (430 kg/m²s). The ripples are eliminated after epoxy is added. The phase is shown since it illustrates ripple better than the magnitude of the impedance for this type of device. The associated ripple in the transmission coefficient ($S_{21}$) for a filter constructed out of similar BAW resonators on a 325 μm thick substrate with a polished backside, with and without epoxy, is shown in FIG. 8. In the case without epoxy, the substrate is placed on a foam layer having an acoustic impedance on the order of air (430 kg/m²s). The ripples are eliminated when the epoxy is added.

Figure 9:
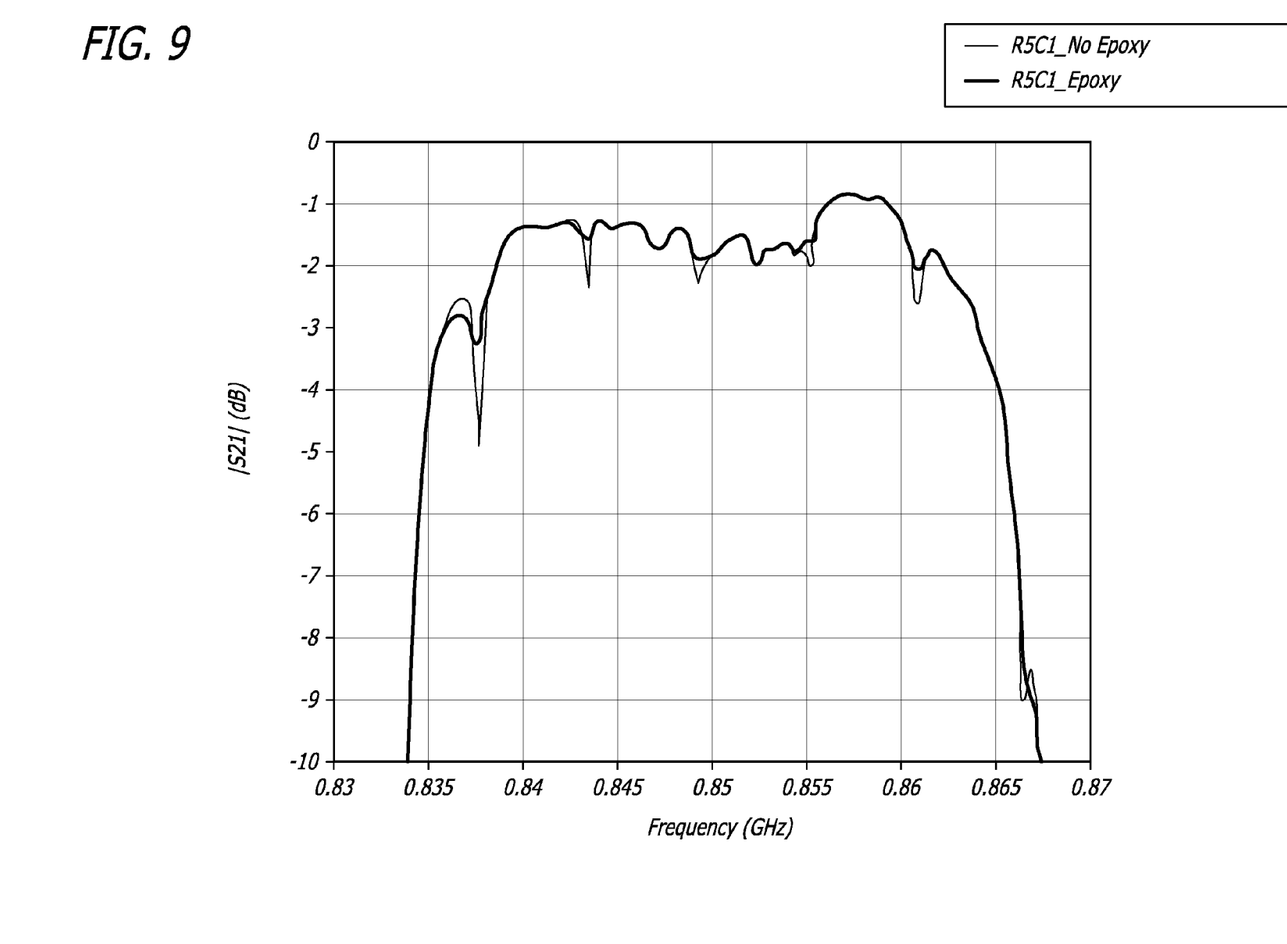
FIG. 9 shows the transmission coefficient ($S_{21}$) response for a filter using BAW resonators on a 725 µm thick substrate with a polished backside, with and without epoxy.

Thinning the wafer improves the effectiveness of the epoxy on suppression of passband ripple. This is illustrated by an example of suppressing ripple in the transmission coefficient $S_{21}$ for a BAW filter on a thick wafer (725 μm) as shown in FIG. 9. The epoxy reduces the ripple amplitude, but the reduction in ripple amplitude is not as pronounced as shown for the thinner substrate (325 μm) in FIG. 8. This is due to the thicker substrate allowing more dispersion of acoustic energy into the substrate that leaked through the Bragg mirror, which diminishes the available acoustic energy that can be reflected from the backside material having the optimal acoustic impedance. For this reason it is desirable to use thin wafers (i.e., ≦400 μm) to improve the effectiveness of the epoxy on suppression of passband ripple.

Figure 10A:
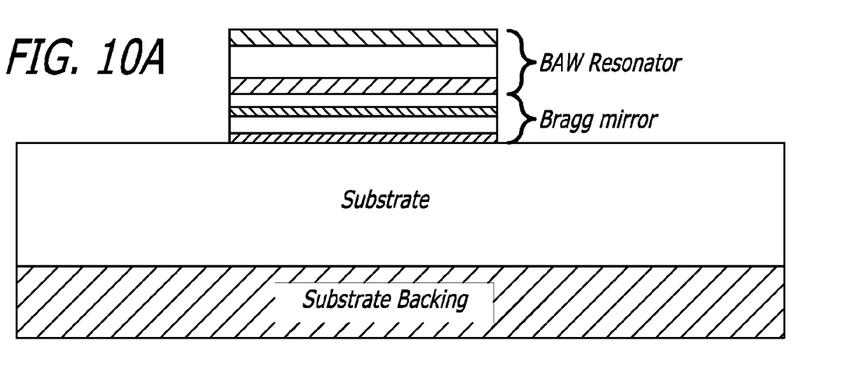
FIGS. 10A and 10B illustrates the generic structure of a BAW resonator on a Bragg mirror on a substrate without and with epoxy on the backside of the substrate.
Figure 10B:
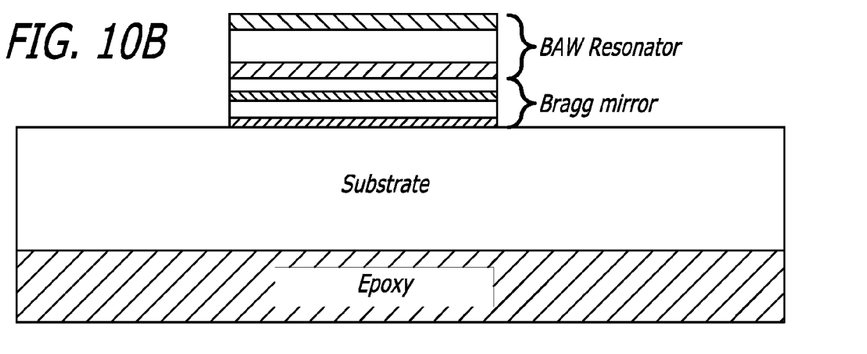

The following description is to provide a better understanding of the various aspects of the invention. The generic structure of a BAW resonator on a Bragg mirror on a substrate is shown in FIG. 10A. In this case the substrate backside may be polished or rough and the substrate backing is arbitrary. One aspect of the invention is that to reduce phase and amplitude ripples in the BAW resonator frequency response, the substrate backside should be polished and coated with a material that has an acoustic impedance in the range of 0.01× to 1× that of the Bragg mirror high impedance layer (i.e., $101 \times 10^6$ kg/m²s for tungsten) and is also a good absorber of acoustic energy (i.e., epoxy), as shown in FIG. 10B.

Figure 11:
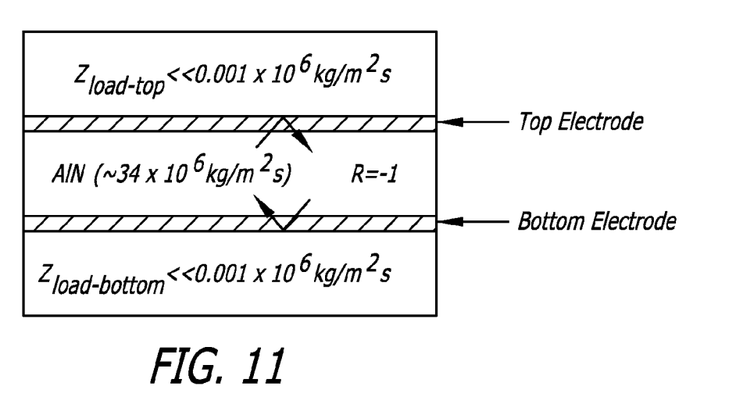
FIG. 11 illustrates a generic BAW resonator structure with a piezoelectric layer bounded by two electrodes.

To understand the operation of this invention, consider the basic BAW resonator shown in FIG. 11. The BAW resonator is composed of the AlN piezoelectric layer sandwiched between two electrodes as shown. In general the BAW resonator is designed to have a low acoustic impedance load (i.e., $\ll 1000$ kg/m²s) presented to each electrode to provide a high reflection coefficient R at each electrode. This will reflect acoustic energy back into the piezoelectric AlN layer for proper operation. For a typical BAW resonator, with a piezoelectric layer that is nominally one-half wavelength thick at the operating frequency, the reflection coefficients are both near negative unity (i.e., $R \approx -1$). For simplicity, the contribution of the electrode mechanical impedance is ignored in this analysis. The mismatch between the relatively high acoustic impedance AlN ($34 \times 10^6$ kg/m²s) and air ($<1000$ kg/m²s) results in $R \approx -1$ as shown. When air is on each side of the AlN (ignoring the contribution of the top and bottom electrodes), then $R \approx -1$ (i.e., -100%) which satisfies this condition.

In a practical BAW resonator this requirement for $R \approx -1$ is easily accomplished for the top electrode by having air as the load impedance, but requires a Bragg mirror (See FIG. 12) to achieve this condition for the bottom electrode in an SMR (solidly mounted resonator) BAW by generating the virtual low impedance $Z_n$. To accomplish this, the acoustic load impedance $Z_{load}$ should be lower than the acoustic impedance of the high acoustic impedance Bragg mirror layers (i.e., tungsten, W, with an acoustic impedance of $101 \times 10^6$ kg/m²s).

To understand the operation of the Bragg mirror, start with the transmission line impedance equation that computes the input impedance $Z_i$ for a section of transmission line of phase shift $\theta_i$, with characteristic impedance $Z_i$ and terminating impedance $Z_{i-1}$:

$$Z_i = Z_i \left[ \frac{Z_{i-1}\cos\theta_i + jZ_i\sin\theta_i}{Z_i\cos\theta_i + jZ_{i-1}\sin\theta_i} \right]$$

Where:
i=1 . . . n, where i=1 is the layer next to the substrate and i=n is the layer nest to the piezo (AlN) layer
$Z_i$ is the acoustic impedance of the considered layer i
$Z_{i-1}$ is the acoustic impedance of the previously considered layer
$\theta_i$ is the phase shift across layer i $$\theta_i = \frac{\omega x d_i}{v_i}$$

Where:
$v_i$ is the velocity of the acoustic wave in layer i
$d_i$ is the thickness of layer i
$\omega$ is the radian frequency
The reflection coefficient R at the top surface of the Bragg mirror is computed using the standard equation:

$$R = \frac{Z_n - Z_p}{Z_n + Z_p}$$

Where:
$Z_p$ is the acoustic impedance of the piezoelectric (AlN) material.
$Z_n$ is the acoustic impedance at the top surface of layer n, which is adjacent to the bottom of the piezoelectric (AlN) layer. For simplicity, the electrodes may be ignored, so assume that the bottom of the AlN piezoelectric layer is in contact with the top of the Bragg mirror.

The above equations are used to compute the reflection coefficient R at the top of the Bragg mirror for the longitudinal wave mode using the acoustic impedances and velocities listed in Table 1.

TABLE 1

Acoustic impedance and velocity for longitudinal wave mode.

| Material | Longitudinal wave acoustic velocity v (m/s) | Longitudinal wave acoustic impedance ($10^6$ kg/m$^2$s) |
|---|---|---|
| Al | 6422 | 17.3 |
| W | 5230 | 101 |
| AlN | 10400 | 34 |
| SiO2 | 5970 | 13.1 |
| Si | 8847 | 19.3 |
| SiN | 11150 | 36.2 |
| Mo | 6660 | 48.6 |
| Epoxy | 2200 | 2.4 |
| Air | N/A | 0.00043 |

Figure 12:
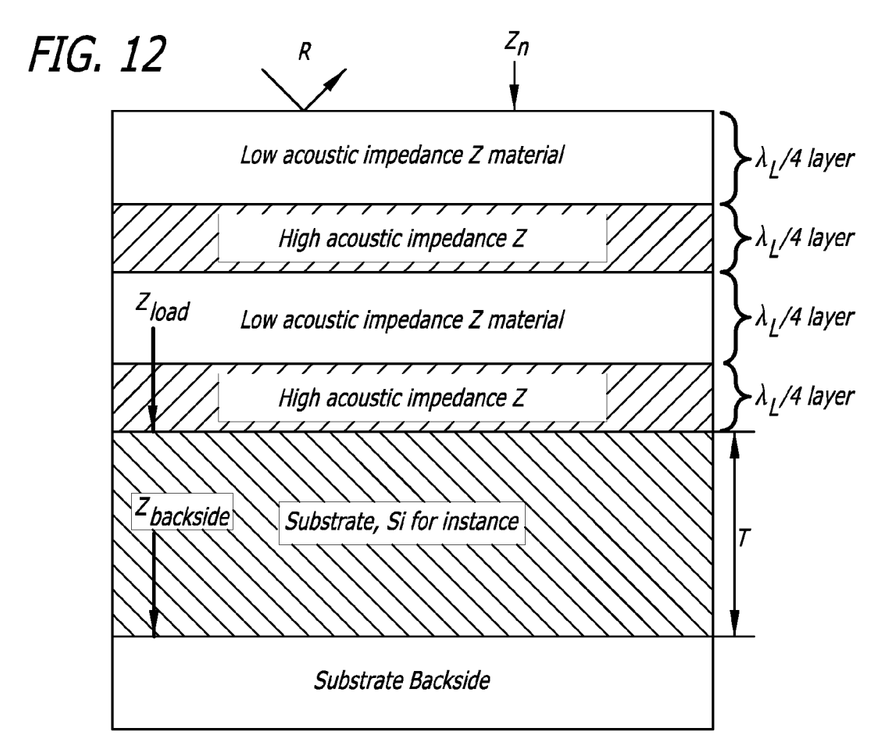
FIG. 12 illustrates a cross-section of a BAW resonator for a substrate with thickness T.

To meet the requirement that the substrate have a lower acoustic impedance than the Bragg mirror high acoustic impedance layer (W in this case), it is typically assumed that the substrate is silicon and infinitely thick. At frequencies where the low and high impedance layers in the Bragg mirror are a quarter wavelength thick ($\lambda_L/4$) for the longitudinal mode, as shown in FIG. 12, this condition will create a very low input acoustic impedance, $Z_n$, and consequently a reflection coefficient R that approaches negative unity. For example, an infinitely thick silicon substrate will present an acoustic load impedance of $Z_{load}=19.3\times10^6$ kg/m$^2$s, and the four layer Bragg mirror will generate an input impedance of $Z_n=0.00546\times10^6$ kg/m$^2$s. Ignoring the bottom electrode gives a reflection coefficient R at the AlN piezoelectric interface of R=−0.9997 (−9.997%).

For a finite thickness substrate (with acoustic impedance $Z_{sub}$) there are frequencies where the substrate thickness T is equal to odd multiples of a longitudinal mode quarter wavelength. When this happens the acoustic impedance of the substrate backside $Z_{backside}$ will be transformed into an acoustic load impedance $Z_{load}$ at the bottom of the Bragg mirror given by:

$$Z_{load}=Z_{sub}^2/Z_{backside}$$

Figure 13:
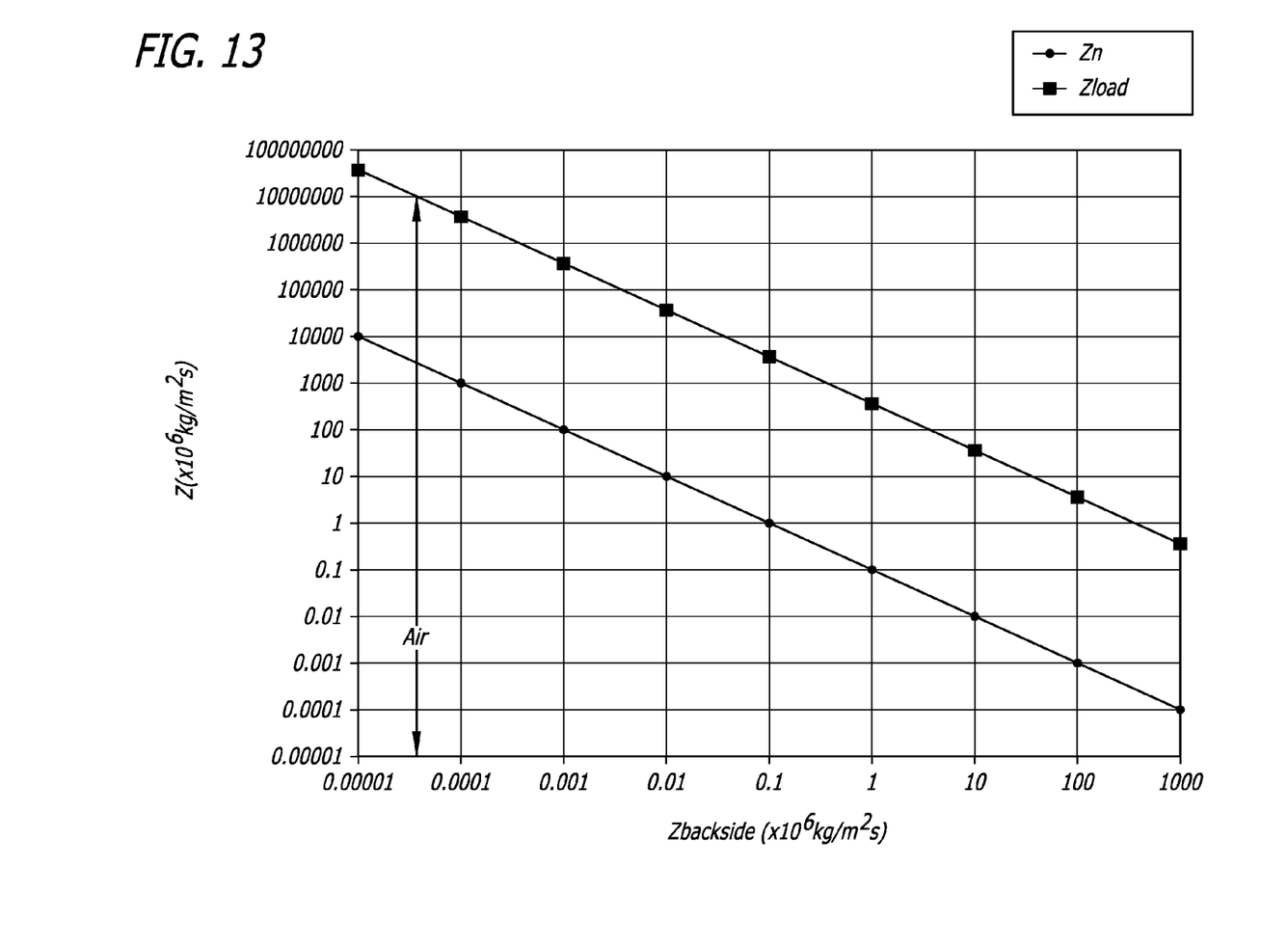
FIG. 13 shows how the acoustic load impedance $Z_{load}$ and input impedance $Z_n$ vary with acoustic backside impedance $Z_{backside}$ for a silicon substrate ($Z_{sub}=19.3\times10^6$ kg/m$^2$s) that is an odd number of quarter wavelengths thick ($T=(2n+1)\lambda_L/4/$ n=0, 1, 2 . . . ).
Figure 14:
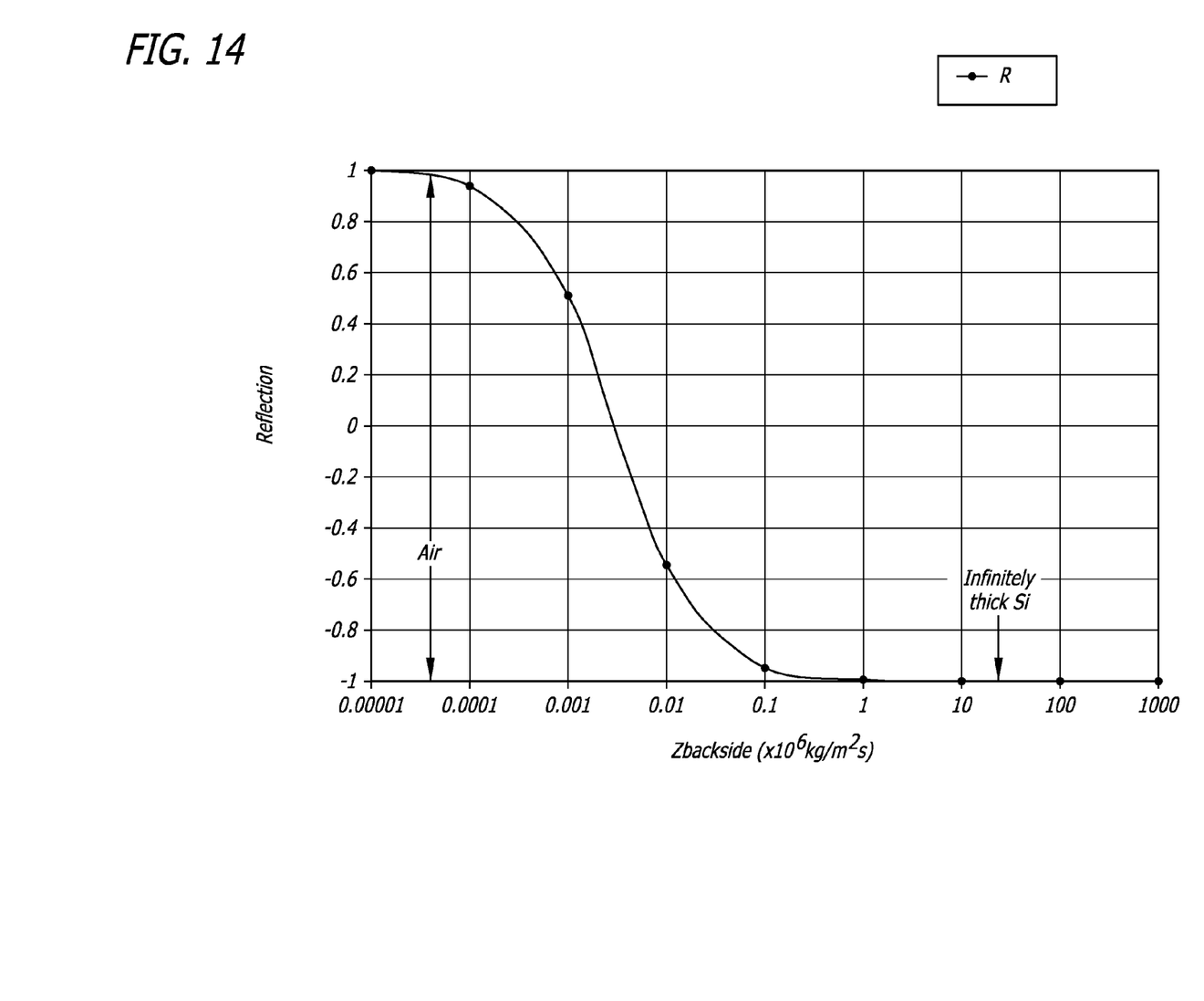
FIG. 14 shows reflection coefficient R at the interface between the BAW resonator in FIG. 11 and the four layer Bragg mirror in FIG. 12 versus backside acoustic impedance when the silicon substrate thickness T is $T=(2n+1)\lambda_L/4$.

FIG. 13 shows how the acoustic load impedance $Z_{load}$ and input impedance $Z_n$ vary with acoustic backside impedance $Z_{backside}$ for a silicon substrate ($Z_{sub}=19.3\times10^6$ kg/m$^2$s) that is an odd number of quarter wavelengths thick (T=(2n+1)$\lambda_L/4$, n=0, 1, 2 . . . ). For example, if the substrate backside is air ($Z_{backside}=430$ kg/m$^2$s) then $Z_{load}\approx9\times10^{12}$ then the Bragg mirror (when it is operating at its design frequency where each layer is at or near $\lambda_L/4$ thick) will transform $Z_{load}$ into $Z_n=2635\times10^6$ kg/m$^2$s and R=0.975 (97.5%), as shown in FIG. 14. This does not satisfy two necessary conditions for proper operation of the BAW resonator:

1. The bottom electrode reflection coefficient (R=0.975) is not of the same sign as the top electrode reflection coefficient (R≈−1). This does not satisfy the necessary boundary condition for proper operation of the BAW resonator.

2. The reflection coefficient is not large enough in magnitude (i.e., >0.99) to prevent leakage from the resonator into the Bragg mirror.

This condition will cause ripples in the BAW resonator response, and they will occur at frequencies where the substrate thickness T is an odd multiple of a quarter wavelength, as given by:

$$freq = (2n+1)\left(\frac{v_{sub}}{4T}\right), n = 0, 1, 2, 3 \ldots$$

For example, for silicon $v_{sub}=8847$ (m/s) and T=725 µm, then freq=(2n+1)3.05 MHz, which means that the ripples will occur every 6.1 MHz as shown in FIG. 5. The acoustic losses in the silicon substrate and the multiple reflection paths from the substrate backside to the bottom of the Bragg mirror (see FIG. 2) smooth out the ripples, which would be much more pronounced in an ideal one dimensional model.

FIG. 14 provides the reflection coefficient R at the interface between the BAW resonator in FIG. 11 and the four layer Bragg mirror in FIG. 12 versus backside acoustic impedance when the silicon substrate thickness T is T=(2n+1)$\lambda_L/4$. For proper resonator operation the ideal boundary condition at the interface is R=−1. FIG. 14 shows that $Z_{backside}$ must be greater than about $1\times10^6$ kg/m$^2$S to achieve a high reflection coefficient of negative polarity (i.e., R=−0/994 for this value). This impedance can be achieved with a variety of epoxy type materials (Table 1 shows that a typical value for an epoxy is $2.4\times10^6$ kg/m$^2$s, which gives R=99.7%) that will adhere to a polished substrate backside. To avoid problems associated with reflections at the epoxy backside itself, this material should have high acoustic attenuation. Most epoxies are lossy to acoustic energy (i.e., 35 dB/mm at 5 MHz), so a 0.25 mm (~0.01") thick layer of epoxy will have about ~10 dB attenuation as the signal propagates each way, for a total of ~20 dB return loss. This has been demonstrated to perform well as shown by the data in FIGS. 7 to 9. The upper bound on the backside impedance is approximately that of this high impedance Bragg mirror layer (i.e., $101 \times 10^6$ kg/m$^2$s for W in this example), otherwise a similar problem will occur when the substrate thickness T is integer multiples of a half-wavelength.

In summary, the acoustic impedance of the material applied to the polished backside should be on the order of 0.01× to 1.0× that of the acoustic impedance of the high impedance Bragg mirror layer. In this example where Tungsten is the high impedance layer, the acoustic impedance of the material applied to the polished substrate backside should range from $1-100 \times 10^6$ kg/m$^2$s. In the data shown, the impedance of the epoxy used was approximately $2.4 \times 10^6$ kg/m$^2$s, which satisfies this condition.

The invention solves the inherent problem of passband ripple in BAW resonators and BAW filters caused by longitudinal modes resonating in the finite thickness BAW resonator substrate. The consequence of this achievement is improved passband linearity, reduced phase dispersion, and adherence to passband insertion loss (I.L.) specifications through elimination of dips in passband.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A method of reducing phase and amplitude ripples in a BAW resonator frequency response comprising:
   providing a substrate;
   fabricating a Bragg mirror having alternate layers of a high acoustic impedance material and a low acoustic impedance material on a first side of the substrate;
   fabricating a BAW resonator on the Bragg mirror;
   coating a second side of the substrate opposite the first side with a lossy material having an acoustic impedance in the range of 0.01× to 1.0× the acoustic impedance of the layers of high acoustic impedance material;
   the substrate of the BAW resonator having a thickness of 400 µm or less;
   the second side of the substrate being a polished surface with a peak-to-peak roughness of approximately 1000 A.

2. The method of claim 1 wherein the lossy material is epoxy.

3. The method of claim 1 wherein the substrate is approximately 325 µm thick.

4. The method of claim 3 wherein the Bragg mirror and the BAW are fabricated on a thicker substrate and then material is removed from the second side to reduce the substrate thickness to approximately 325 µm and polish the second side.

5. The method of claim 4 wherein material is removed by grinding the second side of the substrate.

6. The method of claim 5 wherein the layers of high impedance material are Tungsten.

7. A method of reducing phase and amplitude ripples in a BAW resonator frequency response comprising:
   providing a substrate;
   fabricating a Bragg mirror having alternate layers of tungsten and a low acoustic impedance material on a first side of the substrate;
   fabricating a BAW on the Bragg mirror;
   coating a second side of the substrate opposite the first side with a lossy epoxy material having an acoustic impedance in the range of 0.01× to 1.0× the acoustic impedance of the layers of tungsten;
   the substrate of the BAW resonator having a thickness of 400 µm or less;
   the second side of the substrate being polished to a peak-to-peak roughness of less than approximately 1000 A.

8. The method of claim 7 wherein the Bragg mirror and the BAW are fabricated on a thicker substrate and then material is removed from the second side to reduce the substrate thickness to approximately 325 µm and polish the side surface.

9. The method of claim 8 wherein material is removed by grinding the second side of the substrate.

* * * * *